(12) United States Patent
Lee et al.

(10) Patent No.: US 8,829,491 B2
(45) Date of Patent: Sep. 9, 2014

(54) SEMICONDUCTOR DEVICE

(75) Inventors: Jae-won Lee, Gwacheon-si (KR);
Jun-youn Kim, Hwaseong-si (KR);
Young-jo Tak, Hwaseong-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 96 days.

(21) Appl. No.: 13/149,165

(22) Filed: May 31, 2011

(65) Prior Publication Data

US 2012/0187374 A1 Jul. 26, 2012

(30) Foreign Application Priority Data

Jan. 20, 2011 (KR) .................. 10-2011-0005993

(51) Int. Cl.
*H01L 29/12* (2006.01)
*H01L 21/02* (2006.01)
*H01L 33/12* (2010.01)
*H01L 33/32* (2010.01)

(52) U.S. Cl.
CPC .......... *H01L 21/02378* (2013.01); *H01L 33/12* (2013.01); *H01L 33/32* (2013.01); *H01L 21/02458* (2013.01); *H01L 21/0254* (2013.01); *H01L 21/02573* (2013.01); *H01L 21/02381* (2013.01)
USPC ............... 257/22; 257/76; 257/94; 257/103; 257/77; 257/86; 257/110; 257/113; 257/142

(58) Field of Classification Search
USPC ........... 257/22, 76, 94, 103, 77, 86, 110, 113, 257/142, E29.069, E31.001, E33.001, 257/E33.023, E33.062, E33.066
See application file for complete search history.

(56) References Cited

U.S. PATENT DOCUMENTS

| | | | |
|---|---|---|---|
| 7,714,337 B2 | 5/2010 | Kim et al. | |
| 7,812,337 B2 | 10/2010 | Lee | |
| 2008/0087877 A1 | 4/2008 | Lee | |
| 2008/0272382 A1 | 11/2008 | Kim et al. | |
| 2009/0085054 A1* | 4/2009 | Jeon et al. ..................... | 257/101 |
| 2009/0152578 A1* | 6/2009 | Lee ................. | 257/96 |
| 2010/0025657 A1* | 2/2010 | Nagahama et al. ............. | 257/13 |
| 2010/0117105 A1 | 5/2010 | Ahn et al. | |
| 2010/0133506 A1* | 6/2010 | Nakanishi et al. .............. | 257/13 |
| 2010/0178756 A1* | 7/2010 | Takizawa et al. ............. | 438/493 |

FOREIGN PATENT DOCUMENTS

| | | |
|---|---|---|
| JP | 200954791 | 3/2009 |
| JP | 2009140965 A | 6/2009 |
| KR | 100611491 | 3/2006 |
| KR | 100844722 | 9/2007 |
| KR | 100885190 | 1/2009 |
| KR | 20090128802 A | 12/2009 |

* cited by examiner

*Primary Examiner* — Chuong A Luu
(74) *Attorney, Agent, or Firm* — Harness, Dickey & Pierce, P.L.C.

(57) ABSTRACT

According to example embodiments, a semiconductor device includes a first layer and second layer. The first layer includes a nitride semiconductor doped with a first type dopant. The second layer is below the first layer and includes a high concentration layer. The high concentration layer includes the nitride semiconductor doped with the first type dopant and has a doping concentration higher than a doping concentration of the first layer.

12 Claims, 5 Drawing Sheets

SEMICONDUCTOR DEVICE

CROSS-REFERENCE TO RELATED APPLICATIONS

This application claims priority under 35 U.S.C. §119 to Korean Patent Application No. 10-2011-0005993, filed on Jan. 20, 2011, in the Korean Intellectual Property Office, the disclosure of which is incorporated herein in its entirety by reference.

BACKGROUND

1. Field

Example embodiments relate to a semiconductor device of which a residual stress and pit density are decreased.

2. Description of the Related Art

Sapphire is frequently used as a substrate to form a nitride-based semiconductor device. However, it is difficult to manufacture a chip with sapphire since a sapphire substrate is expensive and solid and has low electroconductivity. Also, when the sapphire substrate is epitaxially grown to a large size, the sapphire substrate bends in a high temperature environment due to its low thermal conductivity, and thus, it is difficult to manufacture a large sapphire substrate. In order to overcome the aforementioned limit, a nitride-based semiconductor device using a silicon substrate instead of the sapphire substrate has been developed. Since the silicon substrate has a higher thermal conductivity than that of the sapphire substrate, the silicon substrate does not significantly bend at a high temperature at which a nitride thin film grows, so it is possible to grow the silicon substrate to a large size.

When a nitride-based semiconductor device, e.g., GaN, grows on the silicon substrate, a thermal tensile stress is incurred on a GaN layer during a cooling process due to a difference between thermal expansion coefficients. If the thermal tensile stress exceeds a threshold value (~400 MPa), cracks occur. Thus, in order to prevent cracks by controlling a stress incurred during growth and cooling processes, several types of buffer layers or interlayers are used, or a patterned growth method is used. Also, since a threading dislocation of about $10^9 \sim 10^{10}$ cm$^{-2}$ is incurred due to a lattice mismatch between the silicon substrate and the GaN layer, in order to prevent this lattice mismatch, a proposal has been made to decrease a dislocation density of a nGaN clad that is a template having an active layer deposited thereon.

SUMMARY

According to example embodiments, a semiconductor device includes a first layer including a nitride semiconductor doped with a first type dopant; and a second layer below the first layer. The second layer includes a high concentration layer. The high concentration layer includes the nitride semiconductor doped with the first type dopant and having a doping concentration higher than a doping concentration of the first layer.

According to example embodiments, the second layer further includes an Al-based nitride layer having a nitride having Al, and an undoped nitride semiconductor layer on the Al-based nitride layer.

According to example embodiments, the Al-based nitride layer includes a nucleation layer having AlN and a buffer layer on the nucleation layer and including AlxGa1-xN (0<x<1).

According to example embodiments, the Al-based nitride layer includes a nucleation layer including AlN, and at least one of a AlxInyGa1-x-yN (0≤x, y≤1, x+y≤1) layer on the nucleation layer and a superlattice layer on the nucleation layer. The superlattice layer includes Alx1Iny1Ga1-x1-y1N/Alx2Iny2Ga1-x2-y2N (0≤x1, x2, y1, y2≤1, x1+y1≤1, x2+y2≤1, x1≠x2 or y1≠y2).

According to example embodiments, the high concentration layer is on the undoped nitride semiconductor layer.

According to example embodiments, the doping concentration in the high concentration layer does not vary or the doping concentration has a profile varying in a gradual or step-wise manner.

According to example embodiments, the high concentration layer is between the undoped nitride semiconductor layer and the Al-based nitride layer.

According to example embodiments, the high concentration layer includes AlxInyGa1-x-yN (0≤x, y≤1, x+y≤1).

According to example embodiments, a dopant contained in the high concentration layer includes one of Si, Ge, Se, Te, C, Mg, Be, Zn, and Sc.

According to example embodiments, the high concentration layer has a doping concentration two times higher than the first layer.

According to example embodiments, a thickness of the high concentration layer is from about 10 nm to about 2 um.

According to example embodiments, the semiconductor device further includes an active layer; and a third layer including a nitride semiconductor doped with a second type dopant. The active layer and the third layer are sequentially on the first layer.

According to example embodiments, the first layer and the third layer include a nitride including gallium.

According to example embodiments, the active layer includes an InGaN-based quantum well structure.

According to example embodiments, a substrate is below the second layer.

According to example embodiments, wherein the substrate includes a silicon substrate or a carbide substrate.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
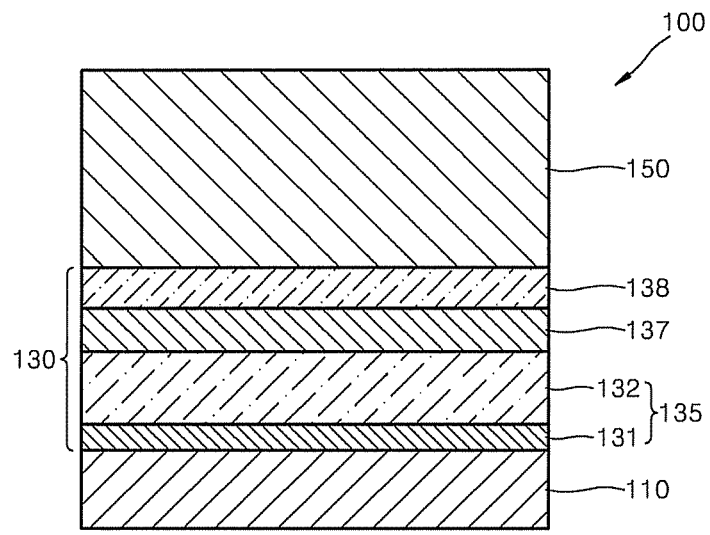
FIG. 1 is a cross-sectional view of a semiconductor device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is, not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a cross-sectional view of a semiconductor device 100 according to example embodiments.

Referring to FIG. 1, the semiconductor device 100 includes a first layer 150 formed of a nitride semiconductor doped with a first type dopant, and a second layer 130 arranged below the first layer 150. The second layer 130 includes a high concentration layer 138 that is formed of a nitride semiconductor heavily doped with the first type dopant, compared to the first layer 150.

The high concentration layer 138 is arranged to ensure a thin film quality of the first layer 150 formed on the second layer 130. That is, the first layer 150 is formed of the nitride semiconductor doped with the first type dopant, for example, the first layer 150 is formed as a GaN layer doped with an n-type dopant so as to decrease the occurrence of cracks during a growth of the first layer 150. In order for a GaN epitaxial layer structure to provide an efficient light emitting structure, a thickness of the GaN layer doped with the n-type dopant has to be from about 2 um to about 10 um. The n-type dopant for the GaN layer may include silicon, and during a Metal Organic Chemical Vapor Deposition (MOCVD) growth, silicon is incorporated into the GaN layer by inserting disilane or a gas thereto. However, silicon functions as an anti-surfactant during growth of the GaN layer so that a surface of the GaN layer is rough, and silicon bends a direction of propagation of a threading dislocation, a structural defect due to a difference between lattice constants of a substrate and a thin film, so that a grown-in compressive stress is relaxed. The stress relaxation is important to the GaN layer grown on a silicon substrate. Because cracks occur due to a thermal tensile stress resulting from a difference between thermal expansion coefficients of the silicon substrate and the GaN layer during a cooling process, and in a case of the GaN layer doped with the n-type dopant, a stress component is added in a tensile direction due to the stress relaxation by the doping, so that the GaN layer is more weak in the occurrence of cracks. This weakness is frequently observed in tests in which the occurrence of the crack depends on the existence or non-existence of doping during growth of GaN layers having the same thickness.

As described above, when the first layer 150 grows, the high concentration layer 138 is provided to restrain the relaxation of the compressive stress or an increase of a tensile stress due to the doping of the n-type dopant. By doing so, it is possible to obtain a good quality thin film of the first layer 150.

Hereinafter, a detailed structure and a material of the semiconductor device 100 will be described.

A silicon substrate or a silicon carbide substrate may be used as a substrate 110. The substrate 110 is necessary in a thin film growth process, and after the semiconductor device 100 is complete or after a semiconductor thin film grows to have a quality enough to function as the semiconductor device 100, the substrate 110 may be removed when necessary.

The second layer 130 including the high concentration layer 138 is formed on the substrate 110. In more detail, the second layer 130 includes an Al-based nitride layer 135 formed of a nitride including Al, an undoped nitride semiconductor layer 137 formed on the Al-based nitride layer 135, and the high concentration layer 138 formed on the undoped nitride semiconductor layer 137.

The Al-based nitride layer 135 is formed to prevent an occurrence of cracks by compensating for a thermal tensile stress occurring during a cooling process after high temperature MOCVD growth so as to form a GaN layer on the substrate 110, for example, the silicon substrate. The Al-based nitride layer 135 may be formed of a nucleation layer 131 including AlN, and a buffer layer 132 including $Al_xGa_{1-x}N$ ($0<x<1$) and arranged on the nucleation layer 131. The nucleation layer 131 may prevent a melt-back phenomenon due to the reaction of the substrate 110 and a nitride semiconductor material and may facilitate wetting of the buffer layer 132 to grow thereafter. During growth of the nucleation layer 131, an Al source is first implanted at an initial step, and the implantation prevents the substrate 110 from being first exposed to ammonia and is then nitrified. For example, the nucleation layer 131 may have a size in the range several tens to several hundreds of nanometer. The buffer layer 132 may be formed of a $Al_xIn_yGa_{1-x-y}N$ ($0 \leq x, y \leq 1$, $x+y \leq 1$) layer or may be formed of a superlattice layer including $Al_{x1}In_{y1}Ga_{1-x1-y1}N/Al_{x2}In_{y2}Ga_{1-x2-y2}N$ ($0 \leq x1, x2, y1, y2 \leq 1$, $x1+y1 \leq 1$, $x2+y2 \leq 1$, $x1 \neq x2$ or $y1 \neq y2$).

The undoped nitride semiconductor layer 137 may be formed of a nitride semiconductor including u-GaN that is not doped with a dopant.

The high concentration layer 138 may include $Al_xIn_yGa_{1-x-y}N$ ($0 \leq x$, $y \leq 1$, $x+y \leq 1$), and is doped with a first type dopant, for example, an n-type dopant. The n-type dopant with which the high concentration layer 138 is doped may include Si, Ge, Se, Te, and/or C. A dopant type included in the high concentration layer 138 may be the same as a dopant type of the first layer 150, and in a case where the first layer 150 is doped with a p-type dopant, the high concentration layer 138 is also doped with the p-type dopant. The p-type dopant may include Mg, Be, Zn, and/or Sc. The high concentration layer 138 may have a doping concentration approximately two times higher than the first layer 150, and a variance of the doping concentration may be constant in the high concentration layer 138. However, according to example embodiments, the high concentration layer 138 may have the variance of the doping concentration which varies in a thickness direction. A thickness of the high concentration layer 138 may be from about 10 nm to about 2 um.

The first layer 150 may be formed of a nitride including Ga, for example, GaN, and is doped with the first type dopant, for example, the n-type dopant. The n-type dopant may include Si, Ge, Se, Te, and/or C.

In the semiconductor device 100 having the aforementioned structure, the high concentration layer 138 increases a surface roughness of a GaN layer when GaN initially grows so as to further induce dislocation inclination or bending, so that pit density is decreased due to reduction in dislocation when GaN initially grows. While GaN grows, a density of threading dislocation causing relaxation of a tensile stress of nGaN is decreased. That is, by decreasing the density of threading dislocation causing the tensile stress by the relaxation during the growth, it is possible to obtain a further compressive stress and then to restrain the occurrence of cracks. Also, by decreasing the pit density when GaN initially grows, it is possible to restrain the pit density from propagating to a template surface.

Figure 2:
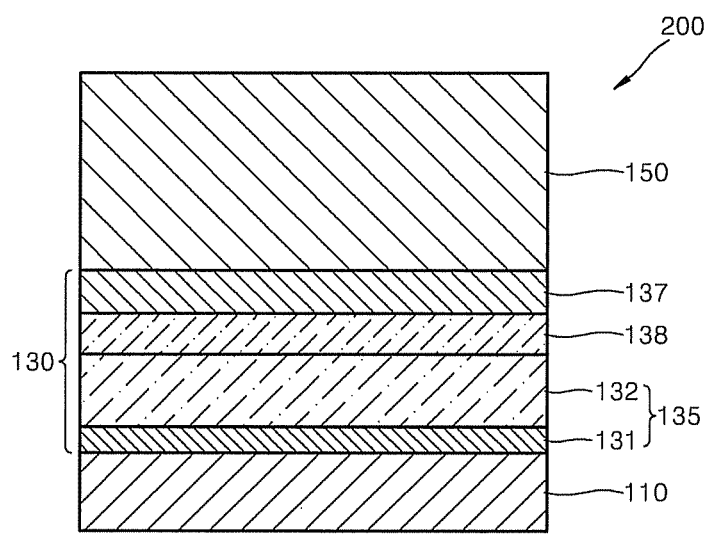
FIG. 2 is a cross-sectional view of a semiconductor device according to example embodiments.

FIG. 2 is a cross-sectional view of a semiconductor device 200 according to example embodiments.

The semiconductor device 200 according to the present embodiment is different from the semiconductor device 100 of FIG. 1 in a location of the high concentration layer 138. The second layer 130 includes the Al-based nitride layer 135, the high concentration layer 138, and the undoped nitride semiconductor layer 137 that are sequentially disposed.

Figure 3:
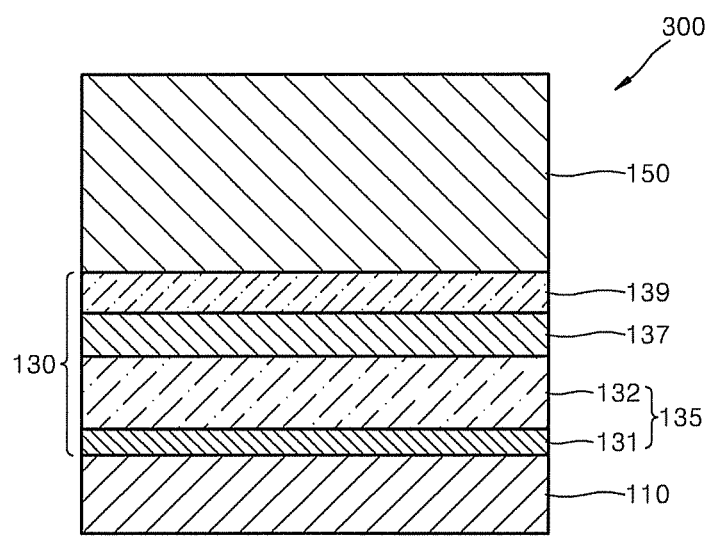
FIG. 3 is a cross-sectional view of a semiconductor device according to example embodiments.

FIG. 3 is a cross-sectional view of a semiconductor device 300 according to example embodiments.

The semiconductor device 300 according to the present embodiment is different from the semiconductor device 100 of FIG. 1 in that a variance of a doping concentration of a high concentration layer 139 has a profile that is not constant but varies in a gradual or step-wise manner. For example, the doping concentration of the high concentration layer 139 may have a variance in which the doping concentration of the high concentration layer 139 is about three times higher than a doping concentration of the first layer 150 in a region of the high concentration layer 139 adjacent to the first layer 150 and varies, for example, gradually or in a stepwise manner to a state similar to the doping concentration of the first layer 150 in a region of the high concentration layer 139 adjacent to the undoped nitride semiconductor layer 137.

Table 1 illustrates results of experimental verification of an improvement of a thin film quality of the first layer 150 according to use of the high concentration layers 138 and 139.

TABLE 1

|  | Comparative example | Example Embodiment of FIG. 1 | Example Embodiment of FIG. 3 |
| --- | --- | --- | --- |
| FWHM [arcsec] | 388 | 340 | 367 |
| (00.2)/(10.2) | 412 | 366 | 407 |
| Pit density [$10^8$ cm$^{-2}$] | 10.0 | 7.6 | 10.0 |
| RMS roughness [Å] | 2.22 | 1.52 | 2.00 |
| Residual stress [MPa] | −435 | −526 | −519 |

Example embodiments of FIG. 1 include, the high concentration layer 138 having a doping concentration that is constantly two times higher than the first layer 150, and example embodiments of FIG. 3 include the high concentration layer 139 having a doping concentration that gradually increases to thrice the doping concentration of the first layer 150. The comparative example corresponds to a case in which the high concentration layers 138 and 139 are absent. As shown in Table 1, in cases of example embodiment of FIG. 1 including the high concentration layer 138 and example embodiment FIG. 3 including the high concentration layer 139, it is possible to see that a Full Width of Half Maximum (FWHM), pit density, RMS roughness, and a residual stress are all improved compared to those of the comparative example. Also, it is also possible to see that, in the example embodiment of FIG. 1 in which the doping concentration is constant, an improvement level is higher than an improvement level of the example embodiment of FIG. 3 in which the doping concentration gradually varies.

Figure 4:
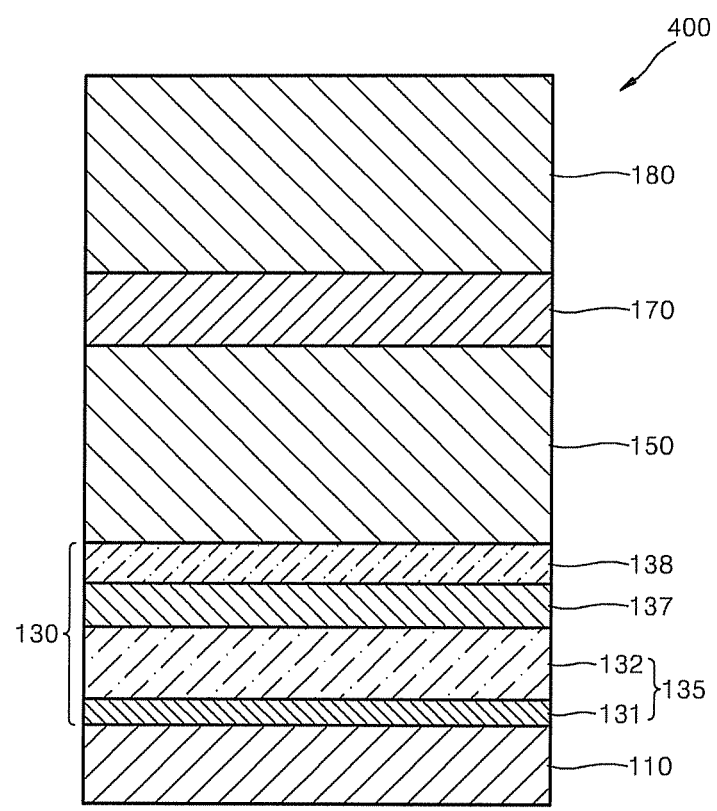
FIG. 4 is a cross-sectional view of a semiconductor device according to example embodiments.

FIG. 4 is a cross-sectional view of a semiconductor device 400 according to example embodiments. The semiconductor device 400 example embodiments is different from the semiconductor device 100 of FIG. 1 in that the semiconductor device 400 further includes an active layer 170 and a third layer 180 formed of a nitride semiconductor doped with a second type dopant.

The active layer 170 emits light by the recombination of electrons and holes. The active layer 170 may be formed of an InGaN-based nitride semiconductor layer, and its emission wavelength bandwidth may be adjusted by controlling a band-gap energy. For example, the active layer 170 may have an InGaN-based quantum well structure including a single quantum well structure in which a quantum well layer and a barrier layer are formed of a pair including InGaN/GaN, InGaN/InGaN, InGaN/AlGaN, or InGaN/InAlGaN, or a multi-quantum well structure, and may adjust its emission color by adjusting a mole fraction of In of an InGaN layer.

The third layer 180 may be formed of the nitride semiconductor doped with the second type dopant. For example, the third layer 180 may be formed of nitride including Ga, and the second type dopant is different from a dopant type of the first layer 150. For example, the third layer 180 may be formed of p-GaN, and a p-type dopant may include Mg, Be, Zn, or Sc.

FIG. 4 shows a basic form of the semiconductor device 400 including an emission structure by a PN junction. In more detail, the semiconductor device 400 further includes an electrode structure in which a voltage is applied to each of the first layer 150 and the third layer 180 so as to cause emission by the combination of electrons and holes in the active layer 170. Also, if necessary, a substrate 110 may be removed when the electrode structure or an emission direction is set.

Figure 5:
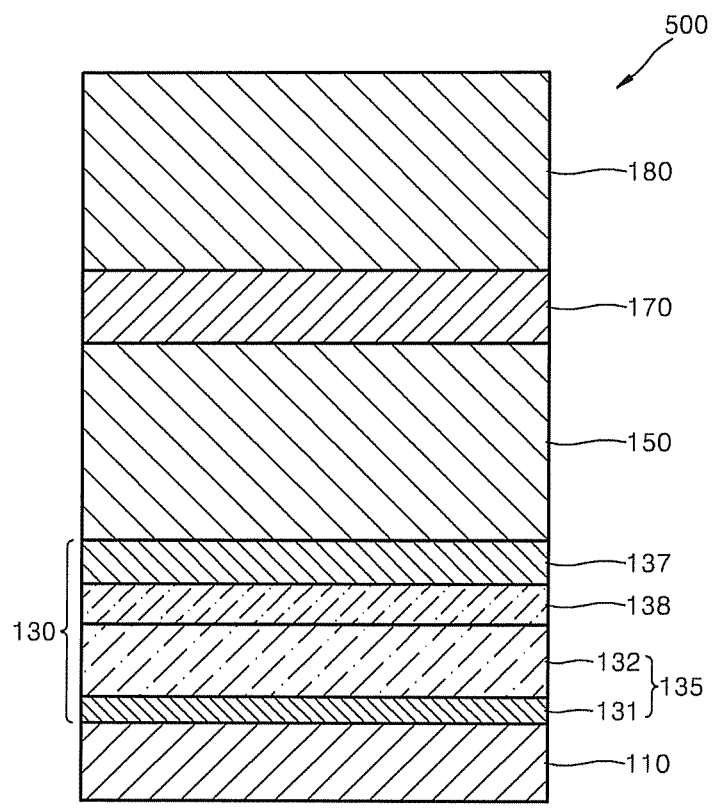
FIG. 5 is a cross-sectional view of a semiconductor device according to example embodiments.

FIG. 5 is a cross-sectional view of a semiconductor device 500 according to example embodiments. Similar to the semiconductor device 400 of FIG. 4, the semiconductor device 500 includes an active layer 170 and a third layer 180 formed of a nitride semiconductor doped with a second type dopant but is different in that the semiconductor device 500 uses the semiconductor device 200 of FIG. 2 as a template forming the active layer 170 and the third layer 180.

Figure 6:
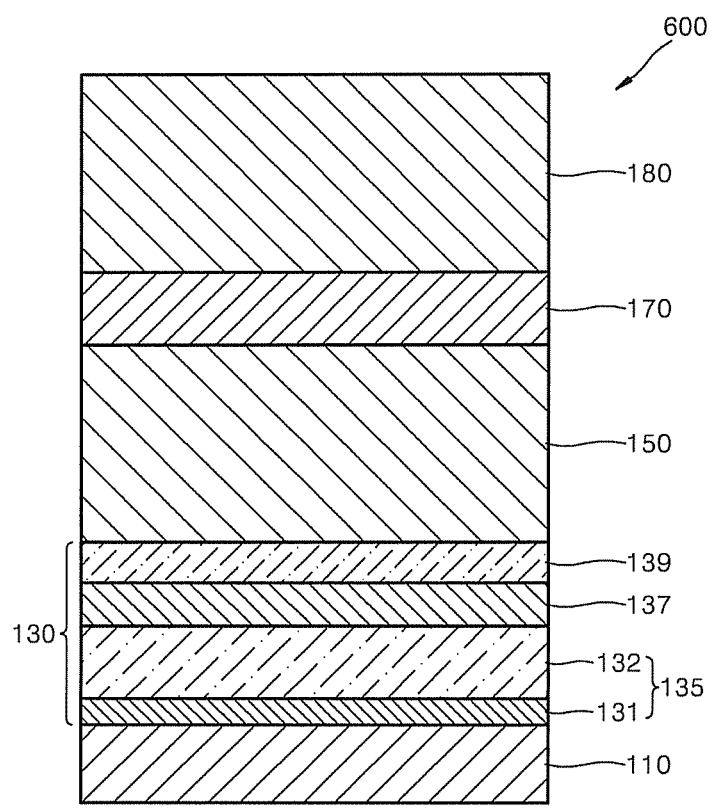
FIG. 6 is a cross-sectional view of a semiconductor device according to example embodiments.

FIG. 6 is a cross-sectional view of a semiconductor device 600 according to example embodiments. Similar to the semiconductor device 500 of FIG. 5, the semiconductor device 600 includes an active layer 170 and a third layer 180 formed of a nitride semiconductor doped with a second type dopant but is different in that the semiconductor device 600 uses the semiconductor device 300 of FIG. 3 as a template forming the active layer 170 and the third layer 180.

The respective semiconductor thin film layers forming the semiconductor devices 100, 200, 300, 400, 500, and 600 may be formed by using one of generally known methods of growing an III-V group compound semiconductor. For example, the methods include a metal organic chemical vapor deposition (MOCVD) method, a hydride vapor phase epitaxy (HVPE) method, a molecular beam epitaxy (MBE) method, a metal organic vapor phase epitaxy (MOVPE) method, a halide chemical vapour deposition (HCVD) method, and the like.

The semiconductor device according to the one or more embodiments of the present invention includes the high concentration layer formed of the nitride semiconductor heavily doped with the dopant, so that a nitride semiconductor layer formed thereafter has decreased residual stress and pit density, and its thin film quality is improved.

Accordingly, the semiconductor device according to example embodiments may be used as a template for forming a high quality nitride semiconductor and may be used as, for example, a light-emitting device having a high light efficiency.

The semiconductor device according to example embodiments of the present invention is provided as an example in which a thin film quality is improved by arranging the high concentration layer formed of the nitride semiconductor heavily doped with the dopant and then by forming the GaN layer having necessary doping concentration, and a detailed structure of the semiconductor device may vary. For example, whether to remove the substrate or a detailed form of each thin film layer may be determined according to necessity of an electrode structure and design requirements, and each thin film layer may be single layer or a plurality of layers.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device, comprising:
    an active layer;
    a first layer below the active layer and including a nitride semiconductor doped with a first type dopant configured to inject electrons or holes into the active layer;
    a second layer below the first layer and including a high concentration layer, the high concentration layer including the nitride semiconductor doped with the first type dopant and having a doping concentration higher than a doping concentration of the first layer; and
    a silicon substrate below the second layer,
    wherein a thickness of the high concentration layer is from about 10 nm to about 2 um, and
    the high concentration layer is configured to restrain at least one of a relaxation of a compression stress and an increase of a tensile stress due to a doping of the first layer.

2. The semiconductor device of claim 1, wherein the second layer further comprises an Al-based nitride layer including a nitride having Al, the undoped nitride semiconductor layer being on the Al-based nitride layer.

3. The semiconductor device of claim 2, wherein the Al-based nitride layer comprises a nucleation layer including AlN and a buffer layer on the nucleation layer and including $Al_xGa_{1-x}N$ (0<x<1).

4. The semiconductor device of claim 2, wherein the Al-based nitride layer comprises a nucleation layer including AlN, and at least one of a $Al_xIn_yGa_{1-x-y}N$ (0≤x, y≤1, x+y≤1) layer on the nucleation layer and a superlattice layer on the nucleation layer, the superlattice layer including $Al_{x1}In_{y1}Ga_{1-x1-y1}N/Al_{x2}In_{y2}Ga_{1-x2-y2}N$ (0≤x1, x2, y1, y2≤1, x1+y1≤1, x2+y2≤1, x1≠x2 or y1≠y2).

5. The semiconductor device of claim 2, wherein the high concentration layer is on the undoped nitride semiconductor layer.

6. The semiconductor device of claim 2, wherein the high concentration layer is between the undoped nitride semiconductor layer and the Al-based nitride layer.

7. The semiconductor device of claim 1, wherein the high concentration layer comprises $Al_xIn_yGa_{1-x-y}N$ (0≤x, y≤1, x+y≤1).

8. The semiconductor device of claim 7, wherein a dopant contained in the high concentration layer comprises one of Si, Ge, Se, Te, C, Mg, Be, Zn, and Sc.

9. The semiconductor device of claim 1, wherein the high concentration layer has a doping concentration two times higher than the first layer.

10. The semiconductor device of claim 1, further comprising:
    a third layer including a nitride semiconductor doped with a second type dopant,
    wherein the active layer and the third layer are sequentially on the first layer.

11. The semiconductor device of claim 10, wherein the first layer and the third layer comprise a nitride including gallium.

12. The semiconductor device of claim 11, wherein the active layer includes an InGaN-based quantum well structure.

* * * * *